US 8,842,998 B2

(12) United States Patent
Delfyett et al.

(10) Patent No.: US 8,842,998 B2
(45) Date of Patent: Sep. 23, 2014

(54) OPTICAL MODULATOR WITH LINEAR RESPONSE

(75) Inventors: Peter J. Delfyett, Orlando, FL (US); Nazanin Hoghooghi, Orlando, FL (US); Josue Davila-Rodriguez, Orlando, FL (US); Michael Goldblatt, McLean, VA (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 201 days.

(21) Appl. No.: 13/394,934

(22) PCT Filed: Feb. 5, 2010

(86) PCT No.: PCT/US2010/023306
§ 371 (c)(1),
(2), (4) Date: May 25, 2012

(87) PCT Pub. No.: WO2011/031337
PCT Pub. Date: Mar. 17, 2011

(65) Prior Publication Data
US 2012/0251129 A1 Oct. 4, 2012

Related U.S. Application Data

(60) Provisional application No. 61/240,724, filed on Sep. 9, 2009.

(51) Int. Cl.
*H04B 10/04* (2006.01)
*H04B 10/50* (2013.01)
*H04B 10/548* (2013.01)
*H01S 5/065* (2006.01)
*H01S 5/40* (2006.01)
*H01S 5/00* (2006.01)

(52) U.S. Cl.
CPC ............ *H01S 5/0656* (2013.01); *H04B 10/505* (2013.01); *H01S 5/4012* (2013.01); *H01S 5/0085* (2013.01); *H04B 10/548* (2013.01)
USPC .......................... 398/188; 398/195; 398/198

(58) Field of Classification Search
USPC ....................................................... 398/188
See application file for complete search history.

(56) References Cited

U.S. PATENT DOCUMENTS

| 4,769,853 | A  | * | 9/1988 | Goodwin et al. ............. 398/188 |
| 6,963,442 | B2 | * | 11/2005 | Yap et al. ........................ 359/326 |
| 2002/0159668 | A1 | * | 10/2002 | Williams et al. ................. 385/3 |
| 2003/0231601 | A1 | * | 12/2003 | Kim ............................... 370/277 |

OTHER PUBLICATIONS

Nemitz, Setup of a stable high-resolution laser system, 2004, University of Stuttgart, pp. 38-40.*

(Continued)

*Primary Examiner* — Ken Vanderpuye
*Assistant Examiner* — Jai Lee
(74) *Attorney, Agent, or Firm* — William Greener; Bond, Schoeneck & King, PLLC

(57) ABSTRACT

Apparatuses and methods for modulating an optical signal are disclosed. One embodiment is a method comprising: phase modulating a slave laser which is injection locked to a master laser to produce an arcsine phase modulated optical signal, and combining the arcsine phase modulated optical signal with an output optical signal from the master laser.

4 Claims, 5 Drawing Sheets

(56) References Cited

OTHER PUBLICATIONS

Ramos et al., Optical Injection Locking and Phase-lock loop Combined Systems, 1994, Optical Society of America, Optics Letters, vol. 19, No. 1, pp. 4-6.*

Chrostowski, Optical Injection Locking of Vertical Cavity Surface Emitting Lasers, 2003, University of California at Berkeley, pp. 3-7.*

Grattan et al., Optical Fiber Sensor Technology, 2000, Kluwer Academic Publisher, pp. 118-119.*

Collett, Polarized Light in Fiber Optics, 2003, the PolaWave Group, p. 257.*

* cited by examiner

US 8,842,998 B2

OPTICAL MODULATOR WITH LINEAR RESPONSE

CROSS REFERENCE TO RELATED APPLICATIONS

This application is a National Stage entry under 35 U.S.C. 371 of PCT/US2010/023306 filed on Feb. 5, 2010, which claims priority to U.S. Provisional Patent Application Ser. No: 61/240,724, filed Sep. 9, 2009, the entireties of which are hereby incorporated by reference.

FIELD OF THE DISCLOSURE

The present disclosure relates to optical communication.

BACKGROUND

Optical modulators have a variety of applications, for example, in signal processing, optical communication, and radio frequency (RF) communication. Conventional electro-optic modulators have an optical modulation transfer function that is inherently nonlinear, which limits the spurious free dynamic range (SFDR) of such modulators. Another conventional approach uses direct modulation of the optical intensity of a laser, but chirp and inefficient power handling are typically drawbacks to this approach.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure.

DETAILED DESCRIPTION

An optical modulator with linear response is disclosed herein. This modulator offers improved spurious free dynamic range as compared to conventional approaches. The linear response is achieved by phase modulating the output of an injection locked slave laser, or modulating the resonance of an injection locked slave laser, and combining the modulated output with the injection source signal from the master laser. In some embodiments, the phase is modulated in an arcsine fashion by tuning the cavity resonance of the slave laser. In some embodiments, the slave laser resides in one arm of a Mach-Zehnder interferometer. In some embodiments, the injection locked slave laser is a vertical cavity surface emitting laser (VCSEL), and a static phase shift is introduced at the output of the VCSEL by detuning the resonant frequency from the injection frequency.

Figure 1:
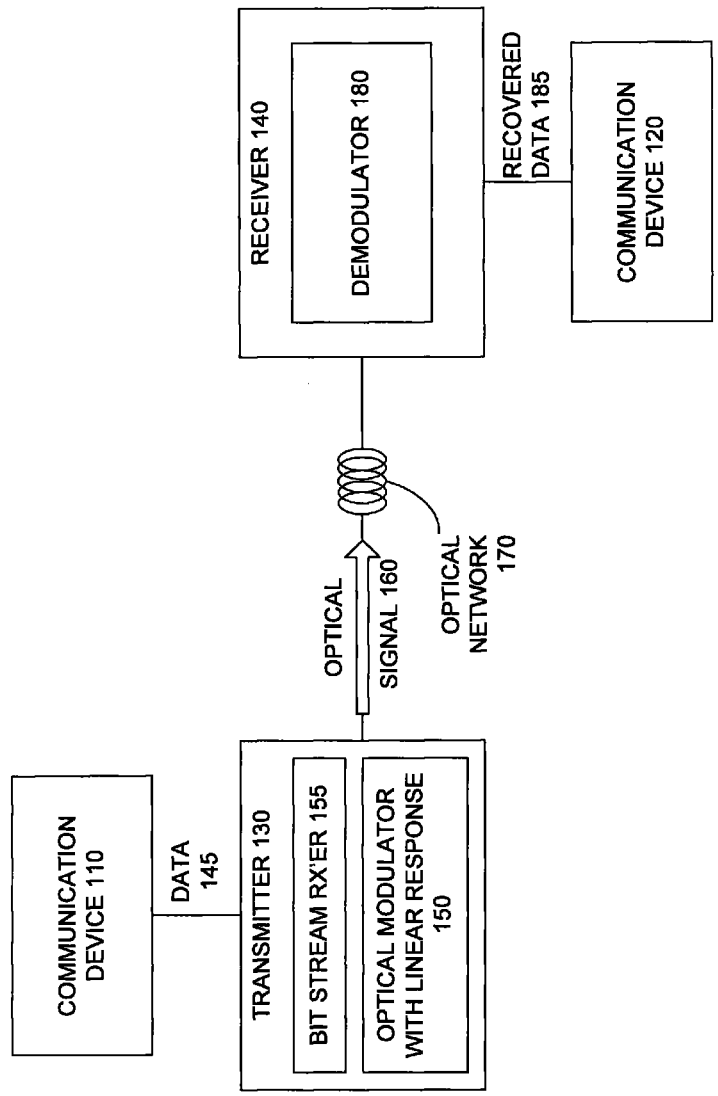
FIG. 1 is a block diagram of an environment in which one embodiment of an optical modulator with linear response is located.

FIG. 1 is a block diagram of an environment in which one embodiment of an optical modulator with linear response is located. Communication devices 110 and 120 communicate through a transmitter 130 and a receiver 140. The communication devices 110, 120 may be computing devices which act as communication endpoints, or may be communication intermediaries such as routers, switches, multiplexers, and/or other components. The communication device 110 provides data 145 to the transmitter 130. An optical modulator with linear response 150, which may be considered part of the transmitter 130, performs phase modulation on an optical beam, thus encoding the data 145. In some embodiments, the transmitter 130 also includes a bit stream receiver 155 that receives the data 145, and which may perform compression, channel encoding, and/or encryption on the data 145 before providing the data 145 to the modulator 150.

The resulting optical signal 160 is transmitted over an optical network 170 to the receiver 140. A demodulator 180 performs demodulation on the received optical signal 160, then supplies the resulting recovered data 185 to the other communication device 120. The recovered data 185 contains the same information as the original data 145.

Although the modulator 150, the demodulator 180, and the optical network 170 process signals in the optical domain, some embodiments of the transmitter 130 and the receiver 140 operate at least partially in the electrical domain, such that the data 145 and the recovered data 185 are represented by electrical and/or electronic signals rather than optical signals. Although the optical modulator with linear response 150 is shown in FIG. 1 as part of the transmitter 130, this is merely a logical representation. While some embodiments may use a modulator 150 which resides in the transmitter device, in other embodiments the modulator 150 may be physically separate from, but in communication with, other components of the transmitter 130. Finally, the optical network 170 may include a variety of components such as amplifiers, repeaters, multiplexers, switches, cross-connects, and/or other components. Since these components are not necessary to explain the operation of optical modulator with linear response 150, they are not shown in FIG. 1 and will not be discussed further.

Figure 2:
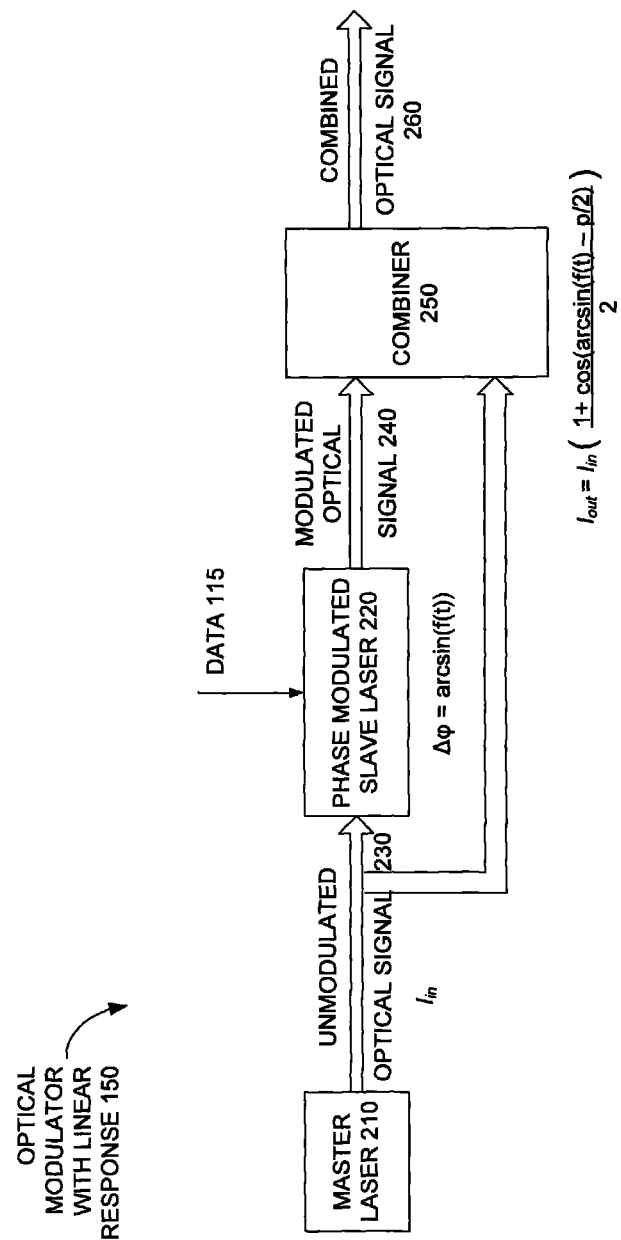
FIG. 2 is a block diagram of the optical modulator from FIG. 1, according to some embodiments.

FIG. 2 is a block diagram of the optical modulator with linear response 150, according to some embodiments. The optical modulator with linear response 150 includes a master laser 210 and a phase modulated slave laser 220. The slave laser 220 is injection-locked to the master laser 210. Thus, the output frequency of the slave laser 220 is locked to the output frequency of the master laser 210 as long as the difference between the master frequency and the free-running frequency of the slave stays within a particular range associated with the slave laser 220, known as the locking range. Any type of laser that is capable of injection locking can be used as the slave laser 220. In some embodiments, the slave laser 220 is a vertical cavity surface emitting laser (VCSEL). Other variations include, but are not limited to, a Fabry-Pérot laser, a distributed feedback laser (DFB), a ring laser, and an erbium laser.

Figure 3:
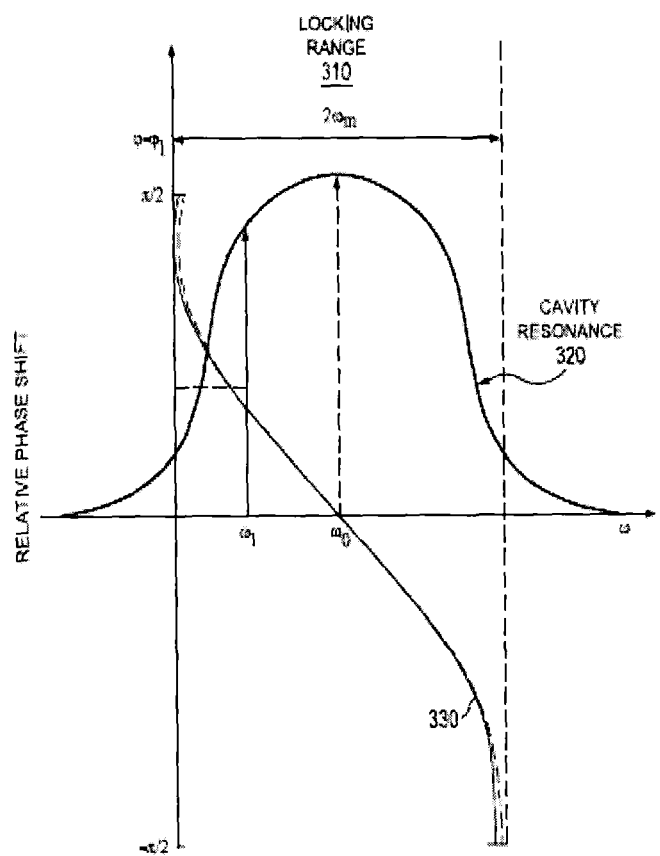
FIG. 3 is a graph illustrating the phase response of the modulated optical signal produced by the optical modulator from FIG. 1, according to some embodiments.

The unmodulated optical signal 230 is injected into the slave laser 220. The slave laser 220 phase modulates its laser output in accordance with the data 145 to produce a modulated optical signal 240. The phase of the modulated optical signal 240 varies in an arcsine manner. This behavior can be seen in FIG. 3, which is a graph illustrating the phase response of the modulated optical signal 240 within the locking range 310 of the slave laser 220. As can be seen in the graph, the phase shift 330 of the modulated optical signal 240 (relative to the phase of the master laser output) varies with the resonance frequency 320 of the slave cavity, in an arcsine manner.

Specifically, the phase of the modulated optical signal 240 is related to the difference between the injected signal frequency and the slave cavity resonance frequency 320. This relationship is given by Equation 1:

$$\varphi(\omega_1) = \arcsin\left(\frac{(\omega_0 - \omega_1)}{\omega_m}\right),$$

where $\omega_1$ is the injected signal frequency, $\omega_0$ is the slave cavity resonance frequency, and $\omega_m$ is half of the locking range 310 of the slave laser 220. Thus, tuning the cavity resonance of the slave laser 220 results in modulating the phase of the slave laser's output in an arcsine manner.

Returning to FIG. 2, the arcsine phase modulated optical signal 240 from the slave laser 220 is combined (250) with the unmodulated optical signal 230 from the master laser 210, to produce a combined optical signal 260. In some embodiments, the combiner 250 takes the form of a Mach-Zehnder (MZ) interferometer. The combination of optical signals can be described by Equation 2:

$$I_{out} = I_{in}\left(\frac{1 + \cos(\arcsin(f(t) - \pi/2))}{2}\right),$$

which can be reduced to Equation 3:

$$I_{out} = I_{in}\left(\frac{1 + f(t)}{2}\right).$$

As can be seen from Equation 3, the combined optical signal 260 is directly proportional to the input signal 230 that is provided by the master laser 210. Thus, the optical modulator with linear response 150 has a linear optical modulation transfer function. This linearity leads to increased spurious free dynamic range (SFDR) as compared to conventional electro-optic modulators, which have an inherent nonlinear optical modulation transfer function. Phase modulating by modulating a detuning between the cavity resonance of the slave laser and the master laser thus produces improved transmission characteristics.

Figure 4:
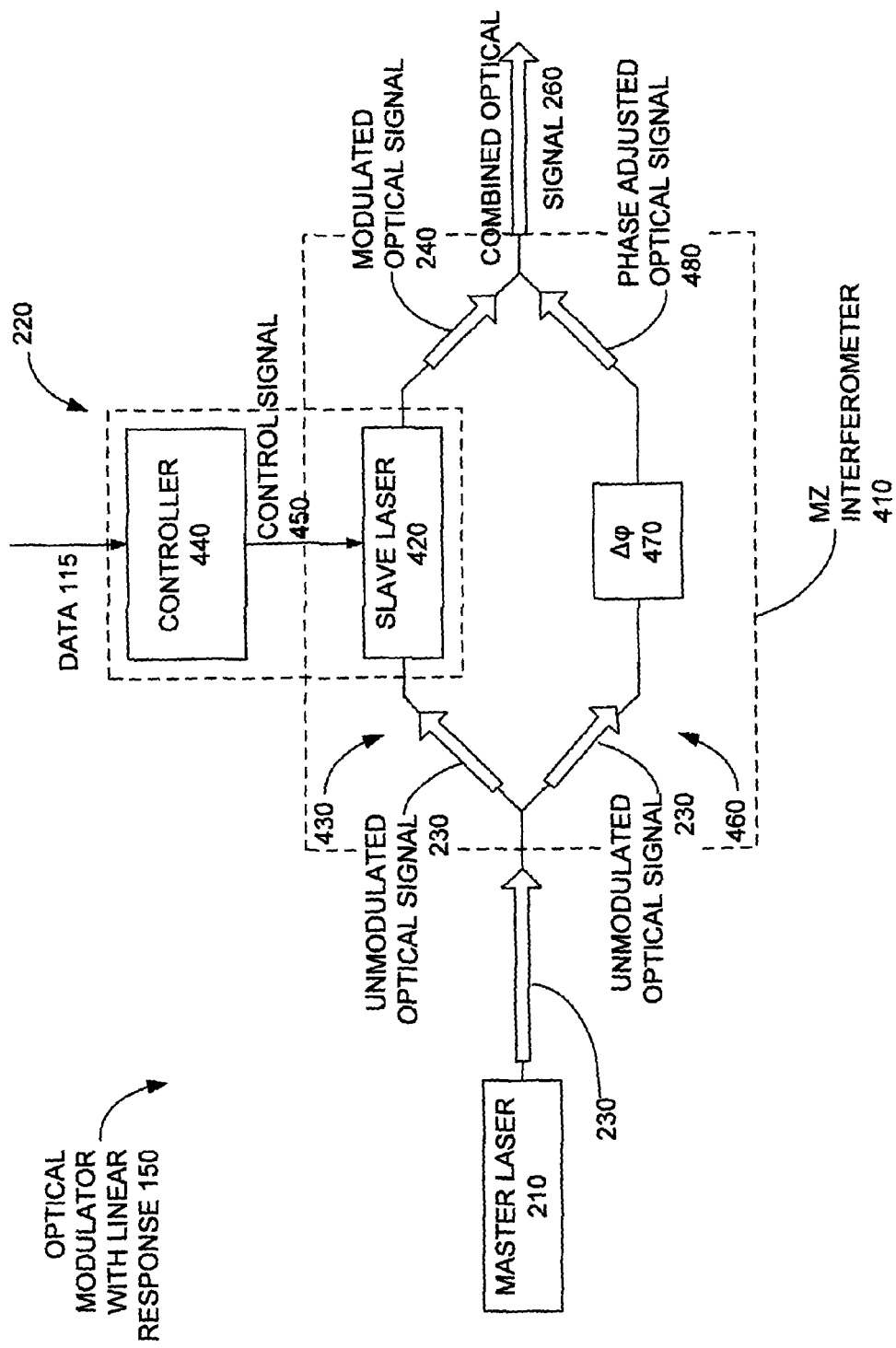
FIG. 4 is a diagram of the structure of the optical modulator from FIG. 1, according to some embodiments.

FIG. 4 is a diagram of the structure of the optical modulator with linear response 150, according to some embodiments. In the embodiment of FIG. 4, the optical modulator with linear response 150 includes a Mach-Zehnder (MZ) interferometer 410. The output 230 of the master laser 210 is coupled to the input of the MZ interferometer 410. The resonant cavity of a slave laser 420 is located in a first arm 430 of the MZ interferometer 410, so that the unmodulated optical signal 230 is input to the slave laser 420. The slave laser 420 is injection-locked to the master laser 210, with the slave resonant cavity being used either in reflection or transmission mode depending on the type of resonant cavity used. A control circuit or controller 440 provides a control signal 450 to the slave laser 420, resulting in a modulated optical signal 240 output from the slave laser 420.

The MZ interferometer 410 combines the phase modulated optical signal 240 from the arm containing the slave laser 420 with the unmodulated optical signal 230 passing through from a second arm 460 of the interferometer 410. As described above in connection with FIGS. 2 and 3, the injection locked slave laser 420 produces an arcsine phase shift in the input signal 230 according to the control signal 450. This arcsine phase shift is given by $\Delta\phi=\arcsin(f(t))$ (Equation 4), where f(t) corresponds to, or is included in, the control signal 450.

The combination of this phase modulated optical signal 240 with the unmodulated optical signal 230 is a combined optical signal 260. As described above in connection with FIGS. 2 and 3, the combined optical signal 260 has a linear relationship to the input signal 230, given by $$I_{out} = I_{in}\left(\frac{1 + f(t)}{2}\right)$$

(Equation 3 from above).

An optical phase shifter 470 is located in the second arm 460 of the interferometer 410, in order to adjust the differential phase of the interferometer 410 to $\pi/2$. As also described above in connection with FIGS. 2 and 3, the combination of this phase modulated optical signal 240 with the phase adjusted unmodulated signal 480 is a combined optical signal 260 which has a linear relationship to the input signal 230, given by $$I_{out} = I_{in}\left(\frac{1 + f(t)}{2}\right).$$

Figure 5:
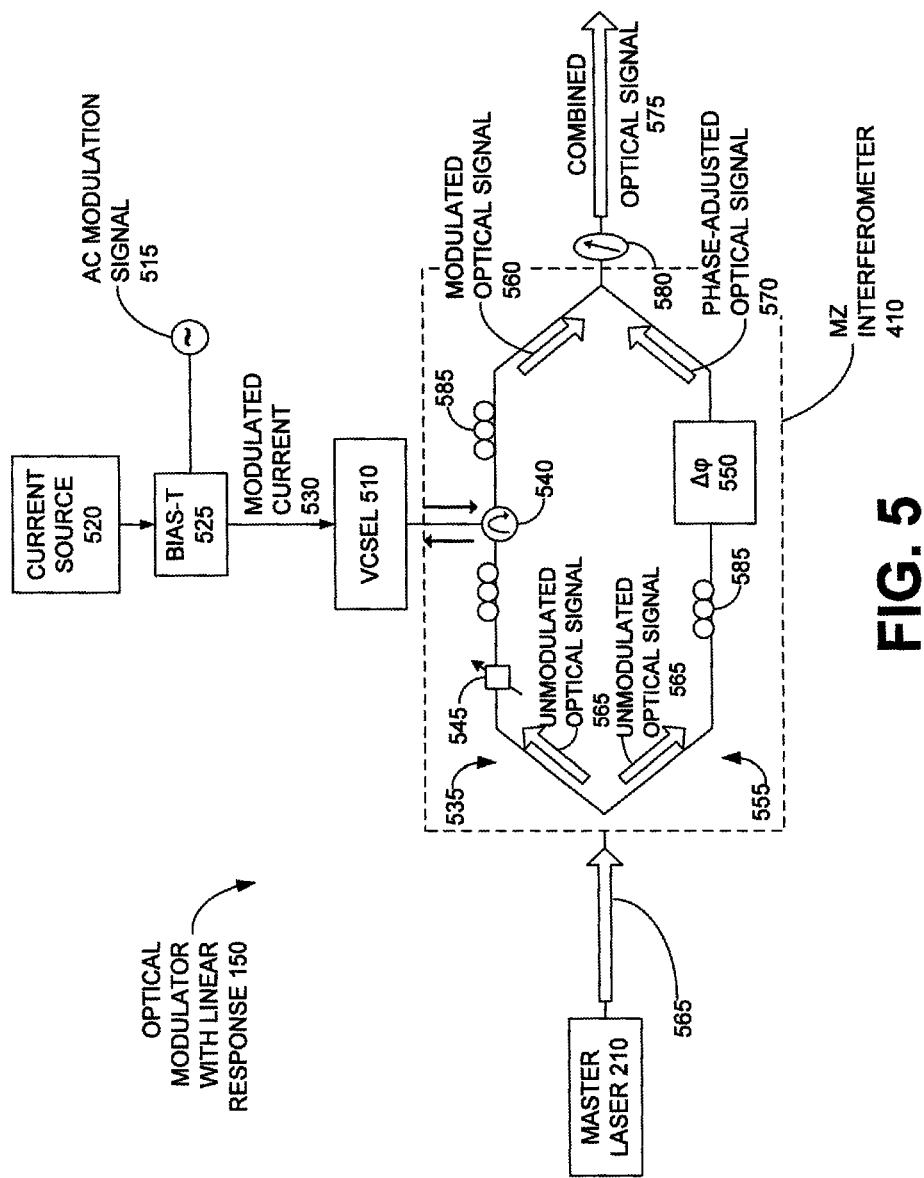
FIG. 5 is a block diagram showing additional detail of one embodiment of the optical modulator from FIG. 1, according to some embodiments.

FIG. 5 is a block diagram showing additional detail of an embodiment of the optical modulator with linear response 150. The output of a master laser 210 is provided to an MZ interferometer 410. A vertical cavity surface emitting laser (VCSEL) 510 is injection locked to the master laser 210, and thus operates as a slave to the master. Phase modulation of the slave is achieved by modulating the driving current of the VCSEL 510. In this regard, an AC modulation signal 515 is combined with a fixed current source 520 using a bias-T junction 525. The bias-T junction 525 places the AC modulation signal 515 on top of the fixed DC driving current of the VCSEL 510, which modulates the driving current (within the locking range) around a fixed bias point. The resulting modulated current 530 is supplied to the VCSEL 510, the effect of which is to tune the cavity resonance of the VCSEL 510.

The VCSEL 510 is coupled to a first arm 535 of the interferometer 410 through an optical circulator 540, such that the VCSEL 510 receives input from the master laser 210 and the VCSEL output exits the interferometer 410. A variable optical attenuator 545 controls the amount of optical power from the master laser 210 that is injected into the VCSEL 510. The ratio of injected power to output power by the VCSEL 510 affects the locking range of the VCSEL 510. An optical phase shifter 550 is located in a second arm 555 of the interferometer 410 in order to adjust the differential phase of the interferometer 410 to $\pi/2$.

The interferometer 410 combines the phase modulated optical output 560 of the VCSEL 510 with the unmodulated optical signal 565 from the master laser 210. As noted earlier, modulating the current of the injection-locked VCSEL 510 results in an arcsine modulation of the input signal 565 according to the AC modulated current signal 530. This arcsine shift is given by $\Delta\phi=\arcsin(f(t))$ (Equation 4), where f(t) corresponds to the AC modulation signal 515.

Combining this arcsine modulated signal 560 with the phase-adjusted signal 570 (i.e., the unmodulated signal in quadrature) produces a combined optical signal 575 which has a linear optical modulation transfer function. The example embodiment of FIG. 5 also includes a polarizer 580 at the output of the MZ interferometer 410 to match the polarization of interfering signals, and polarization controllers 585 are used in both arms 535, 555 of the interferometer 410. A person of ordinary skill in the art should appreciate that if the polarizations are not matched, the depth of modulation of the modulator output signal will decrease.

The foregoing disclosure as been presented for purposes of illustration and description. The disclosure is not intended to be exhaustive or to limit the disclosure to the precise forms disclosed. Various modifications or variations are possible in light of the above teachings. The implementations discussed, however, were chosen and described to illustrate the principles of the disclosure and their practical application to thereby enable one of ordinary skill in the art to utilize the disclosure in various implementations and with various modifications as are suited to the particular use contemplated. All such modifications and variations are within the scope of the disclosure as determined by the appended claims when interpreted in accordance with the breadth to which they are fairly and legally entitled.

What is claimed is:

1. An optical transmitter comprising:
a bit stream receiver configured to receive data; and
an optical modulator, the optical modulator comprising:
a Mach-Zehnder (MZ) interferometer having a pair of arms; a master laser operatively coupled to an input of the MZ interferometer and producing an injected signal;
a slave laser having an optical resonant cavity located in one of the pair of arms, the slave laser being injection-locked to the master laser, the slave laser configured to perform phase modulation on an optical signal thereby encoding the data as a phase modulated optical signal, the phase modulated optical signal having an arcsine phase shift relative to the injected signal; and
an optical phase shifter located in the other of the pair of arms.

2. The optical transmitter of claim 1, wherein the slave laser is a vertical cavity surface emitting laser (VCSEL).

3. The optical transmitter of claim 1, wherein the slave laser is a vertical cavity surface emitting laser (VCSEL) having a drive current input.

4. The optical transmitter of claim 1, wherein the slave laser is a vertical cavity surface emitting laser (VCSEL) having a drive current input, the optical transmitter further comprising:
a current source; and
a bias-T junction operative to combine the current source and a modulated data signal, to produce the drive current input to the VCSEL.

* * * * *